(12) United States Patent
Keller et al.

(10) Patent No.: US 9,287,474 B2
(45) Date of Patent: Mar. 15, 2016

(54) SIDE-EMITTING OPTICAL COUPLING DEVICE

(71) Applicant: CREE, INC., Durham, NC (US)

(72) Inventors: Bernd Keller, Santa Barbara, CA (US); Benjamin Jacobson, Chicago, IL (US); Robert Gengelbach, Rochester, NY (US)

(73) Assignee: CREE, INC., Durham, NC (US)

( * ) Notice: Subject to any disclaimer, the term of this patent is extended or adjusted under 35 U.S.C. 154(b) by 0 days.

(21) Appl. No.: 14/010,828

(22) Filed: Aug. 27, 2013

(65) Prior Publication Data

US 2013/0342096 A1    Dec. 26, 2013

Related U.S. Application Data

(63) Continuation of application No. 11/247,563, filed on Oct. 10, 2005, now Pat. No. 8,541,795.

(60) Provisional application No. 60/618,081, filed on Oct. 12, 2004.

(51) Int. Cl.
*H01L 33/58* (2010.01)
*H01L 33/48* (2010.01)
(Continued)

(52) U.S. Cl.
CPC . *H01L 33/58* (2013.01); *F21K 9/50* (2013.01); *F21K 9/52* (2013.01); *G02B 6/4214* (2013.01);
(Continued)

(58) Field of Classification Search
CPC ....... H01L 33/483; H01L 33/52; H01L 33/54; H01L 33/58; H01L 33/60
USPC ...................... 257/88, 98, E33.067, E33.071, 257/E33.072; 362/606, 607, 608, 609, 610, 362/612, 613, 615, 623, 559, 560, 241, 247, 362/249.02, 297, 300, 302, 304, 305, 362/311.09, 350
See application file for complete search history.

(56) References Cited

U.S. PATENT DOCUMENTS 3,774,021 A * 11/1973 Johnson ........................... 362/27
5,897,201 A    4/1999 Simon ........................... 362/268
(Continued)

FOREIGN PATENT DOCUMENTS

CN    1586017 A    2/2005
EP    1 255 132 A1    11/2002
(Continued)

OTHER PUBLICATIONS

Office Action from U.S. Appl. No. 12/074,762, dated Feb. 17, 2012.
(Continued)

*Primary Examiner* — Eduardo A Rodela
(74) *Attorney, Agent, or Firm* — Koppel Patrick Heybl & Philpott

(57) ABSTRACT

An LED package includes a LED structure that outputs light in a pattern about an axis and an optical coupling device with a central axis. The coupling device is positioned relative to the LED structure and accepts light from the LED. The coupling device includes a first dielectric interface surface that is substantially cylindrical with respect to the central axis, and a reflecting surface. The first dielectric interface surface accepts a first portion of light from the LED structure and directs it toward the reflecting surface. The reflecting surface accepts the light from the first dielectric interface surface and directs it toward the first dielectric interface surface in a direction substantially perpendicular to the central axis.

32 Claims, 5 Drawing Sheets

(51) Int. Cl.
    H01L 33/52    (2010.01)
    G02B 6/42     (2006.01)
    G02B 19/00    (2006.01)
    F21K 99/00    (2010.01)
    H01L 33/54    (2010.01)
    H01L 33/60    (2010.01)
    F21Y 101/02   (2006.01)

(52) U.S. Cl.
    CPC ........ *G02B 19/0028* (2013.01); *G02B 19/0061* (2013.01); *G02B 19/0071* (2013.01); *H01L 33/483* (2013.01); *H01L 33/52* (2013.01); *F21Y 2101/02* (2013.01); *H01L 33/54* (2013.01); *H01L 33/60* (2013.01)

(56) References Cited

U.S. PATENT DOCUMENTS

| | | | | |
|---|---|---|---|---|
| 6,231,220 | B1 * | 5/2001 | Shibuya et al. | 362/507 |
| 6,361,190 | B1 | 3/2002 | McDermott | 362/310 |
| 6,598,998 | B2 | 7/2003 | West et al. | 362/307 |
| 6,607,286 | B2 | 8/2003 | West et al. | 362/255 |
| 6,646,813 | B2 * | 11/2003 | Falicoff et al. | 359/641 |
| 6,674,096 | B2 | 1/2004 | Sommers | 257/98 |
| 6,679,621 | B2 * | 1/2004 | West et al. | 362/327 |
| 6,995,402 | B2 * | 2/2006 | Ludowise et al. | 257/91 |
| 7,006,306 | B2 * | 2/2006 | Falicoff et al. | 359/800 |
| 7,009,213 | B2 * | 3/2006 | Camras et al. | 257/98 |
| 7,021,797 | B2 * | 4/2006 | Miñano et al. | 362/355 |
| 7,111,964 | B2 | 9/2006 | Suehiro et al. | 362/328 |
| 7,118,262 | B2 | 10/2006 | Negley | 362/555 |
| 7,202,507 | B2 * | 4/2007 | Isokawa | 257/95 |
| 7,455,423 | B2 * | 11/2008 | Takenaka | 362/231 |
| 7,677,760 | B2 * | 3/2010 | Simon | 362/235 |
| 2002/0057056 | A1 | 5/2002 | Okazaki | |
| 2003/0156416 | A1 | 8/2003 | Stopa et al. | |
| 2005/0094393 | A1 | 5/2005 | Czajkowski | |
| 2005/0263785 | A1 | 12/2005 | Kim et al. | |
| 2005/0276066 | A1 | 12/2005 | Kim et al. | 362/561 |
| 2006/0018010 | A1 | 1/2006 | Blumel | |
| 2006/0119250 | A1 | 6/2006 | Suehiro et al. | 313/498 |
| 2007/0029563 | A1 | 2/2007 | Amano et al. | |
| 2007/0121343 | A1 | 5/2007 | Brown | |
| 2007/0247856 | A1 | 10/2007 | Wang et al. | |

FOREIGN PATENT DOCUMENTS

| | | |
|---|---|---|
| EP | 1255132 A1 | 11/2002 |
| JP | 05-183194 | 7/1993 |
| JP | 5183194 | 7/1993 |
| JP | 997927 | 4/1997 |
| JP | 2000299500 A | 10/2000 |
| JP | 2003008081 | 1/2003 |
| JP | 2004-140327 A | 5/2004 |
| JP | 2004140327 | 5/2004 |
| JP | 2004-281606 A | 10/2004 |
| JP | 2004281606 | 10/2004 |
| JP | 2004140327 | 5/2013 |
| WO | WO 2008000244 A2 | 1/2008 |
| WO | WO 2008077338 A1 | 7/2008 |
| WO | WO 2008140884 A1 | 11/2008 |

OTHER PUBLICATIONS

Response to OA from U.S. Appl. No 12/074,762 filed May 16, 2012.
Office Action from U.S. Appl. No. 12/074,762, dated May 8, 2013.
Second Office Action from Chinese Patent Appl. No. 200980115965.2, dated Jan. 21, 2013.
European Search Report from European Patent Application No. 12164833.1-2423, dated Sep. 24, 2012.
Examination Report from European Patent Application No. 09716428.9-2423, dated Sep. 7, 2012.
Decision of Rejection from Japanese Patent Application No. 2007-536779, dated Jul. 24, 2012.
First Office Action from Chinese Application No. 200980115965.2, dated Apr. 6, 2012.
Office Action from Korean Patent Application No. 10-2007-7010841, dated: Dec. 19, 2011.
Office Action from U.S. Appl. No. 12/074,762, dated: Oct. 28, 2011.
Second Examination Report for European Patent Application No. EP 09716428.9 dated Oct. 7, 2011.
Office Action for counterpart Taiwan Patent Application No. TW 094135548 dated Aug. 2, 2011.
Examiner's First Report for counterpart Australian Patent Application No. 2005295913 dated Jun. 30, 2010.
International Preliminary Report on Patentability dated Aug. 6, 2007 for counterpart Application No. PCT/US05/36438.
Office Action from European Patent Application No. 09 716 428.9 dated Feb. 24, 2011.
International Preliminary Report on Patentability for PCT Application No. PCT/US09/01212 mailed Mar. 7, 2011.
Notice of Reasons for Rejection for counterpart Japanese Patent Application No. 2007-536779 dated May 19, 2011.
Office Action from U.S. Appl. No. 12/074,762, dated: Feb. 3, 2011.
Office Action from U.S. Appl. No. 12/074,762, dated: Jul. 22, 2010.
Response from U.S. Appl. No. 12/074,762, dated Nov. 22, 2010.
PCT International Search Report and Written Opinion From Related PCT Application No. PCT/US2009//001212, Dated: Jul. 3, 2009.
First Official Communication from the EP0 pursuant to Article 94(3) EPC. Dated: Jul. 8, 2008, Europe application No. 05 802 983.6.
PCT Notification of Transmittal of International Preliminary Report on Patentability From PCT/US05/36438, Dated Sep. 26, 2007.
PCT International Search Report and Written Opinion From PCT/US05/36438, Dated Feb. 2, 2006.
Patent Abstracts of Japan, vol. 017, No. 599, Nov. 2, 1993 Koichi.
Patents Abstracts of Japan, vol. 2000, No. 13, Feb. 5, 2001, Mayumi.
Patent Abstracts of Japan. vol. 1997, No. 08, Aug. 29, 1997, Toshiba Corp.
Third Office Action from Chinese Patent Appl No. 200980115965.2, dated Sep. 14, 2013.
Fourth Office Action from Chinese Patent Appl. No. 200980115965.2. dated Apr. 21, 2014.
Office Action from U.S. Appl. No. 12/074,762. dated Nov. 25, 2013.
Office Action from U.S. Appl. No. 12/074,762, dated Mar. 20, 2014.
Response to OA from U.S. Appl. No. 12/074,762, filed May 8, 2014.
Extended European Search Report from European Appl. No. 14177165.9-1555, dated Sep. 30, 2014.
Office Action from U.S. Appl. No. 12/074,762, dated Jun. 6, 2014.
Office Action from U.S. Appl. No. 12/074,762, dated Jul. 2, 2015.
Office Action from U.S. Appl. No. 12/074,762, dated Jan. 15, 2015.
Patent Certificate from Chinese Patent No. ZL 2009801159652, dated Mar. 25, 2015.
Examination Report from European Patent Appl. No. 12 164 833.1-1756, dated Jun. 2, 2015.
Office Action from Korean Patent Appl. No. 10-2010-7022263. dated Jun. 4, 2015.

* cited by examiner

SIDE-EMITTING OPTICAL COUPLING DEVICE

RELATED APPLICATION DATA

This application is a continuation of, and claims the benefit of, U.S. patent application Ser. No. 11/247,563, filed Oct. 10, 2005, which claims the benefit U.S. Provisional Application Ser. No. 60/618,081 filed Oct. 12, 2004.

BACKGROUND OF THE INVENTION

1. Field of the Invention

This invention relates to light emitting diode (LED) packages and more particularly to side-emitting LEDs.

2. Description of Related Art

As illustrated in FIG. 1, many light sources, including many light emitting diode (LED) semiconductor die, produce light in a Lambertian radiation pattern with respect to an axis perpendicular to the base plane of the die. The majority of the light leaving the die is substantially forwardly directed, although much of it is at a wide angle. Many applications, however, require substantially all light to be directed at a wide angle, approaching or somewhat exceeding 90°, with little or no light at forward angles.

In order to obtain a wide angle distribution of light from an LED package, a side-directing lens configured to redirect light may be added to the LED package. FIG. 2 illustrates a known LED package with such a lens. The LED package includes an LED chip, a lens with straight vertical sidewalls and a funnel-shaped top surface. There are two main paths in which light travels through the package. The first light path P1 is desirable. The light emitted from the chip travels to the top surface where total internal reflection (TIR) causes the light to exit through the sidewall at approximately 90° to the longitudinal axis. The second light path P2 is light emitted from the chip towards the sidewall at an angle that causes TIR or reflection from the sidewall toward the top surface at an angle that allows the light to exit through the top surface. This path is not desirable and limits the efficiency of side extracted light.

U.S. Pat. No. 6,607,286 discloses such another side-directing lens. The lens, which is shown in FIG. 3, includes a sawtooth, refractive portion and a top funnel portion. The sawtooth portion is intended to refract and bend light so that the light exits the lens close to 90° with respect to the longitudinal axis of the LED. The sawtooth feature of this lens, however, makes the lens difficult to manufacture. For example, during an injection molding process, the undercuts of the sawtooth feature necessitate a side action injection mold.

SUMMARY OF THE INVENTION

Briefly, and in general terms, the invention is directed to light emitting diode (LED) packages and lenses for directing and emitting light at the side of an LED or other light source. In one aspect, the invention relates to an LED package that includes an LED structure that outputs light in a pattern about an axis and an optical coupling device with a central axis. The coupling device is positioned relative to the LED structure and accepts light from the LED. The coupling device includes a first dielectric interface surface that is substantially cylindrical with respect to the central axis, and a reflecting surface. The first dielectric interface surface accepts a first portion of light from the LED structure and directs it toward the reflecting surface. The reflecting surface accepts the light from the first dielectric interface surface and directs it toward the first dielectric interface surface in a direction substantially perpendicular to the central axis.

In another aspect, the invention relates to a lens for use with a light emitting device that outputs light in a pattern about an axis. The lens includes a first dielectric interface surface that is substantially cylindrical with respect to a central axis and a reflecting surface that includes an inward-extending portion that extends into the cylinder defined by the first dielectric interface surface.

In yet another aspect, the invention relates to a method of directing light from a light emitting device. The method includes generating light output from the light emitting device in a pattern about an axis and redirecting the light output using an optical coupling device having a central axis and positioned relative to the LED structure to accept light from the LED. The device includes a first dielectric interface surface that is substantially cylindrical with respect to the central axis, and a reflecting surface. Redirecting light includes accepting a first portion of light from the LED structure at the first dielectric interface surface and directing it toward the reflecting surface and accepting the light from the first dielectric interface surface at the reflecting surface and directing it toward the first dielectric interface surface in a direction substantially perpendicular to the central axis.

These and other aspects and advantages of the invention will become apparent from the following detailed description and the accompanying drawings which illustrate by way of example the features of the invention.

DETAILED DESCRIPTION OF THE PREFERRED EMBODIMENTS

The present invention provides light emitting diode (LED) packages and lenses that cause the light emitted from a light source to be substantially sideways emitted from the package instead of forward emitted. Such an LED package includes an LED structure that outputs light in a pattern about an axis and an optical coupling device or lens with a central axis. The coupling device is positioned relative to the LED structure and accepts light from the LED. The coupling device includes a first dielectric interface surface that is substantially cylindrical with respect to the central axis, and a reflecting surface. The first dielectric interface surface accepts a first portion of light from the LED structure and directs it toward the reflecting surface. The reflecting surface accepts the light from the first dielectric interface surface and directs it back toward the first dielectric interface surface as opposed to allowing the light to pass through the reflecting surface. The light is directed toward the first dielectric interface surface in a direction substantially perpendicular to the central axis such that the light is emitted through the first dielectric interface surface. Accordingly, light that would otherwise be emitted in the forward direction is sideways emitted.

Figure 1:
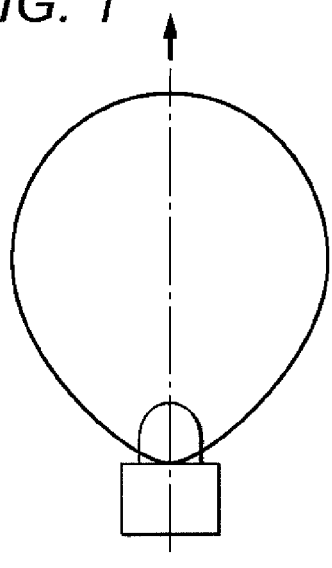
FIG. 1 is an illustration of the illumination pattern of a typical LED.
Figure 2:
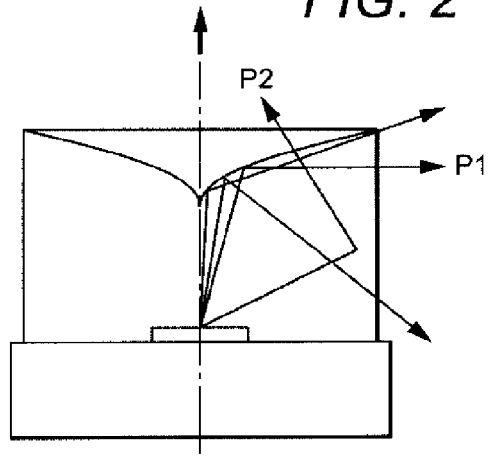
FIG. 2 depicts a known LED package.
Figure 3:
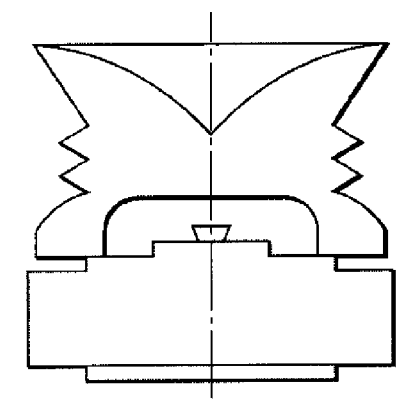
FIG. 3 depicts another known LED package.
Figure 4:
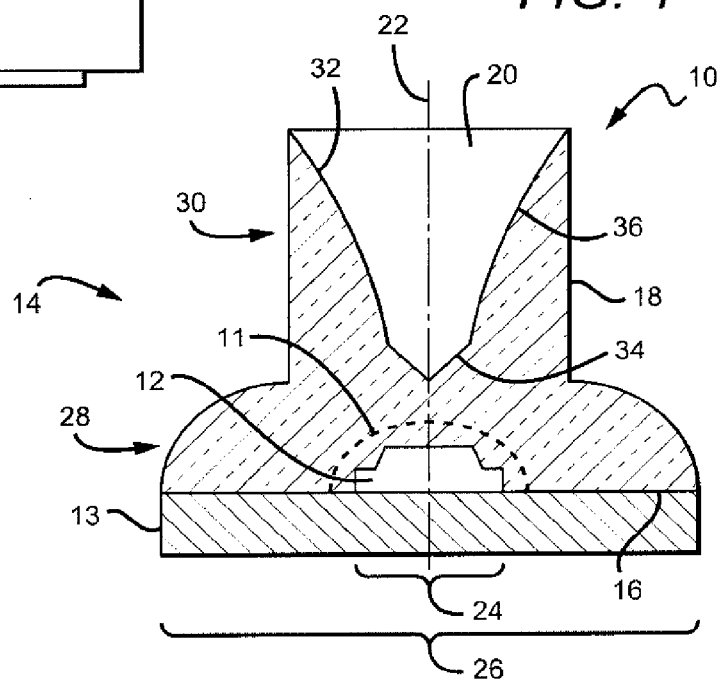
FIG. 4 is a sectional view of an LED package configured in accordance with the invention and including an LED structure and an optical coupling device or lens.
Figure 5:
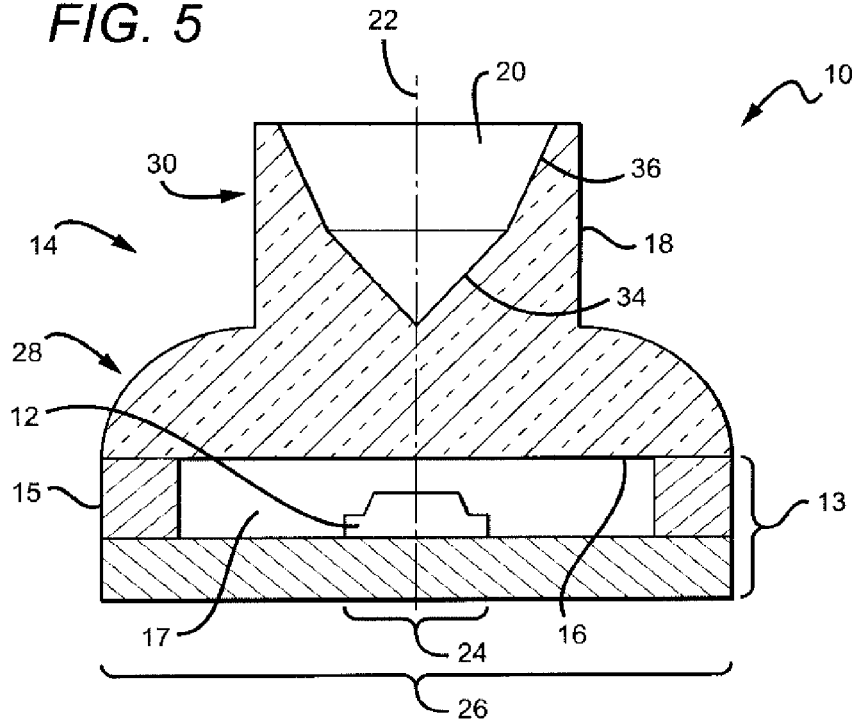
FIG. 5 is a sectional view of another LED package configured in accordance with the invention.

Referring now to the drawings and particularly to FIGS. 4 and 5, there are shown two exemplary configurations of side-emitting LED packages 10. Each package 10 includes an LED 12 on a base structure 13 and a body 14 positioned relative to the LED and the base structure such that light from the LED is introduced into the body.

In the configuration of FIG. 4, the LED 12 is located in the interior of the body 14 and light is emitted in the body at its interior. This configuration may be made by forming the body 14 directly over the LED 12 and on the surface of the base structure 13 by, for example, injection molding. In an alternate version of this configuration, an encapsulating material 11 is formed over the LED 12 to protect the LED during the body formation process.

In the configuration of FIG. 5, the LED 12 is located beneath the lower surface 16 of the body 14 and light enters the body through the lower surface. In this configuration, the body 14 is manufactured as a separate component using a number of well-known techniques such as diamond turning (i.e., the lens is shaped by a lathe with a diamond-bit), injection molding, and casting. The body 14 is adhesively secured to the base structure 13, which includes a perimeter support 15 that surrounds the LED 12. Prior to securing the body 14, the volume 17 between the LED 12 and the perimeter support 15 may be filled with an optically transparent material, including but not limited to resin, silicone, epoxy, or any material with an index of refraction within the same range as the material forming the body. Alternatively, the volume 17 may be filled with a medium having an index of refraction different from the body, such as air.

The body 14 can be made of many different materials capable of transmitting light, but is preferably made of a transparent material, including but not limited to glass, silicone, acrylic, cyclic olefin copolymer (CCC), polymethylmethacrylate (PMMA), polycarbonate (PC), PC/PMMA, and polyetherimide (PET). The body 14 has an index of refraction (n) ranging from between 1.4 and 1.6 and is preferable about 1.5.

Figure 6:
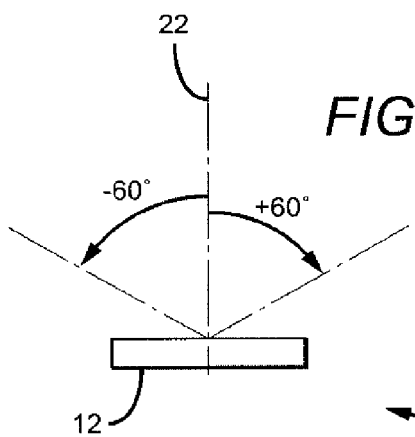
FIG. 6 is a graphical depiction of the angular distribution of light relative to an axis perpendicular to the LED emission axis.

With continued reference to FIGS. 4 and 5, the transparent body 14 has a lower surface 16, a side surface 18, and a top surface 20. The body 14 accepts light from the LED 12 having a wide angular distribution relative to a central axis 22 or central plane of the body. With reference to FIG. 6, "wide angular distribution" as used herein typically means angles up to and exceeding +60° and −60°, relative to the central axis, as indicated by the shaded area. Returning to FIGS. 4 and 5, in general the light is emitted from a region having an extent 24, in the direction perpendicular to the central axis or plane, significantly smaller than the extent 26 of the body itself.

Figure 11:
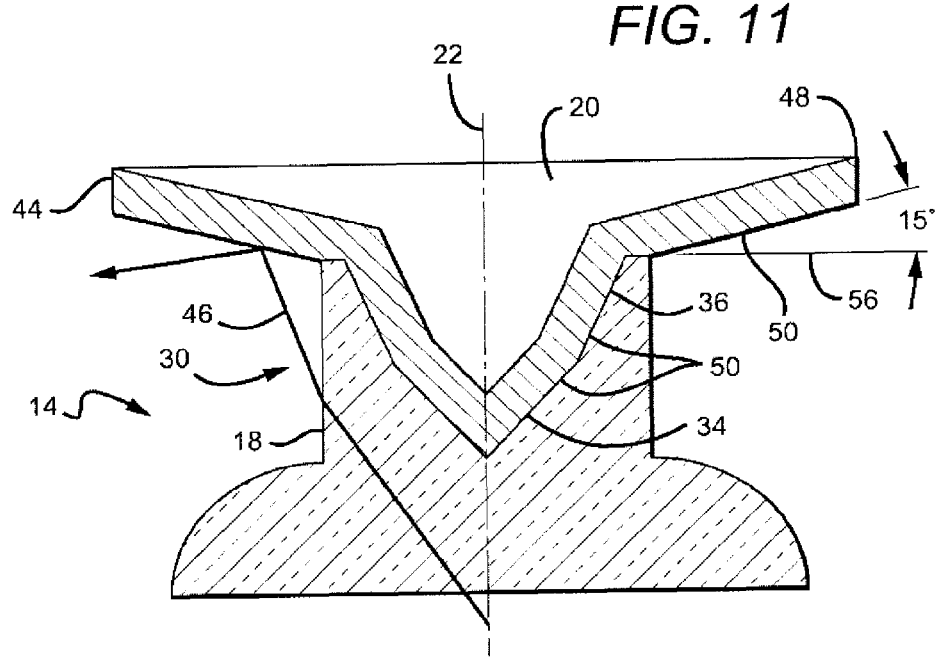
FIG. 11 is a combination sectional view of an alternate embodiment of a lens and schematic representation of the optical properties of the lens.
Figure 12:
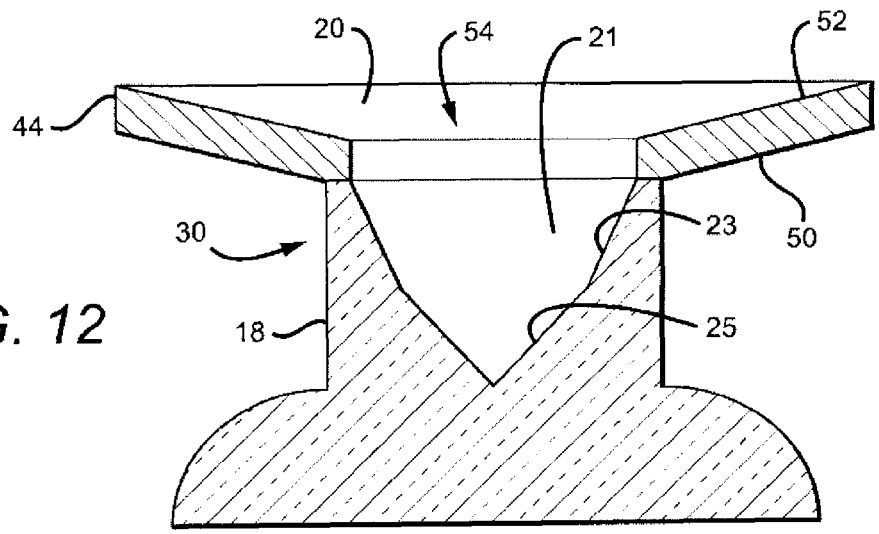
FIG. 12 is a sectional view of an alternate configuration of the lens of FIG. 11.

The side surface 18 is a dielectric interface (for example, with air) permitting transmission of light having appropriate angles. The side surface 18 has a lower portion 28 and an upper portion 30. The top surface 20 is made reflective, for example, by coating the inner cone surface 32 of the body 14 with a metallic reflector layer, or by adding a second body (as shown in FIGS. 11 and 12) having a metallic reflective layer that faces the body. This top surface 20 has an inner portion 34 and an outer portion 36. In a preferred embodiment, both the side surface 18 and the top surface 20 are in the form of surfaces of revolution about the central axis 22, and the upper portion 30 of the side surface 18 is roughly parallel to this central axis.

Figure 7:
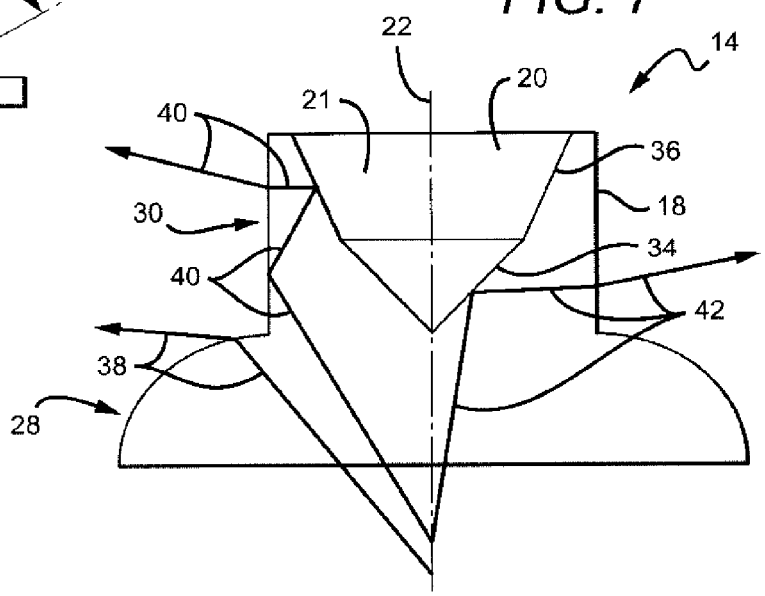
FIG. 7 is a schematic representation of the optical properties of the lens of FIG. 5.
Figure 8:
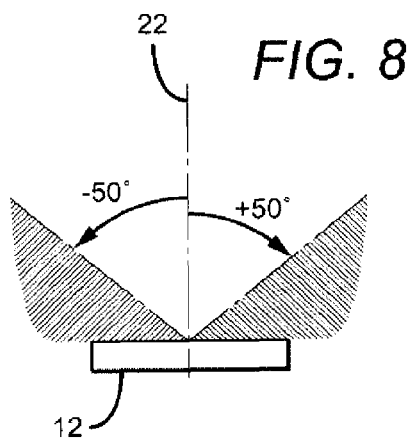
FIGS. 8, 9 and 10 are graphical depictions of various portions of light distribution relative to an axis perpendicular to the LED emission axis.

With reference to FIG. 7 and regarding the optical properties of the LED package 10, a wide-angle fraction of the light 38 is redirected by refraction at the lower portion 28 of the side surface 18, to exit the body 14 roughly perpendicular to the central axis 22. With reference to FIG. 8, a "wide-angle" as used herein means angles beyond approximately ±50° relative the central axis 22, as indicated by the shaded area.

Figure 9:
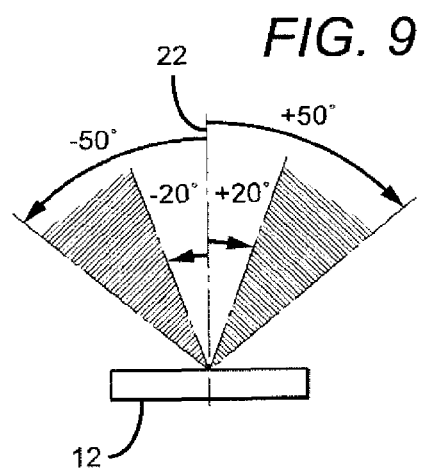

Returning to FIG. 7, a narrower-angle fraction of the light 40 is incident on the upper portion 30 of the side surface 18. With reference to FIG. 9, a "narrow-angle" as used herein means angles within roughly ±50° but beyond roughly ±20° relative the central axis 22 as indicated by the shaded region. Because the upper portion 30 of the side surface 18 is parallel to the central axis 22, this light impinges on the side surface with incident angles approaching or exceeding the critical angle, and the majority or even substantially all of the light is reflected at the side surface.

Returning to FIG. 7, the redirected light 40 then impinges on the outer portion 36 of the top surface 20, where it is reflected back toward the upper portion 30 of the side surface 18, with an associated change in angle. The change in angle is such as to cause the redirected rays 40 to make a much smaller incident angle with the side surface 18 and therefore to be transmitted through the upper portion 30 of the side surface. In a preferred embodiment, a majority of the reflected rays 40 are nearly perpendicular to the upper portion 30 of the side surface 18, and therefore the light exits the body 14 approximately normal, i.e., to the side surface. "Nearly perpendicular" within this context means incident angles of less than about 20° relative to the surface of the upper portion 30. "Approximately normal" means exit angles of less than about 30° relative to the surface of the upper portion 30.

Figure 10:
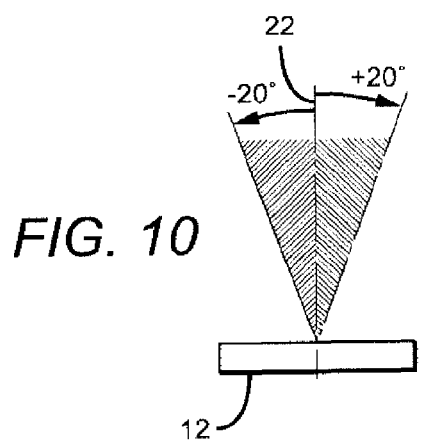

With continued reference to FIG. 7, a narrowest-angle fraction of light 42 impinges on the inner portion 34 of the top surface 20 without first being reflected at the side surface 18. As illustrated in FIG. 10, a "narrowest-angle" as used herein means angles within roughly ±20° of the central axis 22, as indicated by the shaded area. This fraction of light 42 is also redirected by reflection toward the upper portion 30 of the side surface 18 at angles approximately normal to the upper portion 30 of the side surface, and therefore this fraction of light also exits the body 14 approximately normal to the central axis 22.

A smaller amount of light is also emitted from the body in directions other than the main ray paths 38, 40, 42 listed above. For example, Fresnel reflections, haze in the material, and surface roughness are known to cause stray light, some of which will be emitted from the body 14 in unwanted high angles. Within this context, "high angles" means angles outside ±30° of the surface of the upper portion 30. There can also be a minority of ray paths that impinge on the upper portion 30 of the side surface 18 with incidence angles less than the critical angle, so that they are not fully reflected, but are partially transmitted at high angles. A minority of ray paths can also be refracted into relatively high angles by parts of the lower portion 28 of the side surface 18.

With reference to FIG. 11, in another embodiment of the invention, optical performance can be further be improved by redirecting some of the unwanted high-angle rays 46, through the addition of a reflective third section 44 to the top surface 20 of the body 14. The third section 44 extends outward with respect to the upper portion 30 of the side surface 18 so that it can redirect light into desired side-emitting angles. The third section 44 can be angled relatively perpendicular to the central axis 22 to increase the fraction of light so redirected. In a further embodiment, a third section 44 positioned such that it is angled from between 10° to 30° relative to a line 56 perpendicular to the central axis has been found to further increase the amount of light perpendicular to the central axis 22, while increasing the total height of the device by an acceptable amount.

In the embodiment shown in FIG. 11, the third section 44 is part of a cup 48 that includes the inner and outer portions 34, 36 of the reflecting surface 20. The cup 48 is configured to fit in a bore 21 (shown in FIG. 7) formed in the upper portion of the body 14. The cup 48 may be made of any suitable material, such as plastic or metal, and may be formed using any one of several known techniques, such as stamping or machining. The bottom surfaces 50 of the funneled cup is reflective either through the formation of the cup using a reflective material or by coating or plating the surfaces with a reflective material. The funnel cup 48 may be secured to the body 14 using an adhesive, such as a silicone adhesive, that is compatible with the body 14 material.

With reference to FIG. 12, in another embodiment, the third section 44 may be formed as a tapered ring 52 instead of part of a cup. In this case, the opening 54 of the ring 52 is sized to substantially coincide with the inner diameter of the bore 21 in the top portion 30. In this case the lower surface and the surfaces 23, 25 of the bore 21 form the top, reflecting surface 20. As with the embodiment of FIG. 8, the ring 52 may be secured to the body 14 using an adhesive, such as a silicone adhesive, that is compatible with the body 14 material. In another embodiment, all portions of the reflecting surface are formed as part of a unitary body 14, through a molding or machining process. It is understood that many other sections or devices can be added to direct light emission beyond those described herein.

Figure 13:
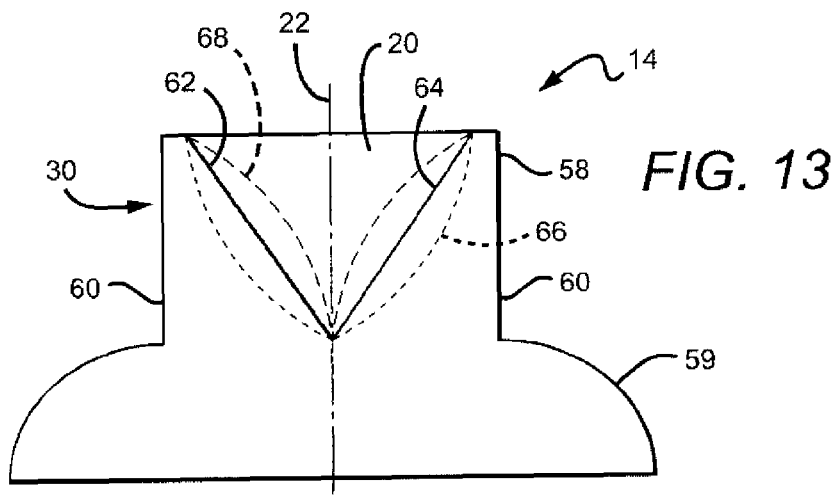
FIG. 13 is a general schematic of a lens configured in accordance with the invention.

While the preceding description has focused on the optical properties produced by the arrangement of the various surfaces of the body 14 of FIGS. 7 and 11, the body may be configured to have other surfaces arrangements and characteristics. As illustrated in FIG. 13, in general terms, the body 14 has a first dielectric interface surface 58 that is cylindrical about the central axis 22 of the body and a second dielectric interface surface 59 beneath the first dielectric interface surface that extends outward beyond the first dielectric interface surface. "Cylindrical" in this context means that the outer lines 60 produced by slicing the upper portion 30 through the central axis are substantially parallel with the central axis. Cylindrical does not necessarily mean that the cylinder defined by the first dielectric interface surface 58 is circular in cross section. The second dielectric interface surface 59 is generally convex, meaning a surface having a curved form which bulges outward, resembling the exterior of a curved body, e.g., sphere or cylinder, or a section of these bodies.

The body 14 also has a reflecting surface 20 that extends into the cylinder defined by the first dielectric interface surface 58. The reflecting surface 20 may be formed of a single surface 62, which may have a substantially linear cross-section 64, convex cross-section 68 or concave cross-section 66. "Concave" in this context means a surface having a curved form which bulges inward, resembling the interior of a curved body, e.g., sphere or cylinder, or a section of these bodies. The surface 20 is obliquely angled with respect to the central axis 22, with the angle of a concave surface or convex surface being measured using a line through the opposite end points of a cross section of the surface.

Alternatively, the reflecting surface 20 may be formed of multiple surfaces 34, 36 (FIGS. 4 and 5), which may be linear, concave, convex or any combination of the three, e.g., linear/linear, linear/concave, linear/convex, concave/linear, concave/convex, convex/linear or convex/concave. The relative sizes of the surfaces along the central axis may range between substantially the same (FIG. 5) to very different (FIG. 4). The angles of the surface 62 or surfaces 34, 36, relative to the central axis 22 may also vary. The ultimate characteristics of these various features of the body 14 depends on various factors, including constraints on the size of the body, the structure of the LED and its emission angle range, the intended positioning of the LED with respect to the body, the indices of refraction of the various mediums through which the light will travel, including the index of the body and any other mediums, e.g., epoxy, resin, air, etc., between the LED and body. Given these various factors, one of ordinary skill in the art of optics may tailor the features of the body to obtain the desired optical performance.

Figure 14:
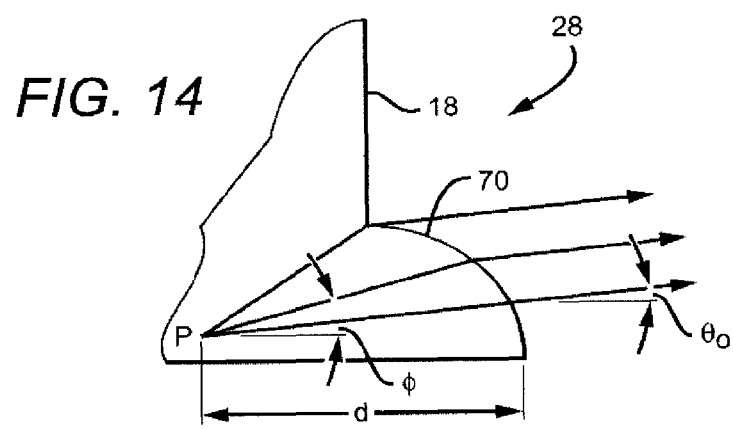
FIGS. 14 and 15 are schematics of a portion of a lens configured in accordance with the invention.

With reference to FIG. 14, in one embodiment, at least one region 70 of the lower portion 28 of the side surface 18 is shaped so that substantially all the rays emanating from a selected point P toward that region are refracted into an angle $\theta_0$ relative to the horizontal axis. The cross-sectional shape of the region 70 may be given in polar coordinates by the equation:

$$\rho(\phi) = \frac{d}{\cos\theta'_0} \frac{1 - \cos(\theta'_0 - \theta_0)/n}{1 - \cos(\phi - \theta_0)/n}$$

where d is the distance from the selected point to the outer edge of the region in the horizontal direction, $$\theta'_0 = \arcsin\left(\frac{\sin\theta_0}{n}\right),$$

and n is the refractive index of the dielectric medium. In a preferred embodiment, the selected point P is in the neighborhood of the center of the light source and 2d=the total diameter of the body.

Figure 15:
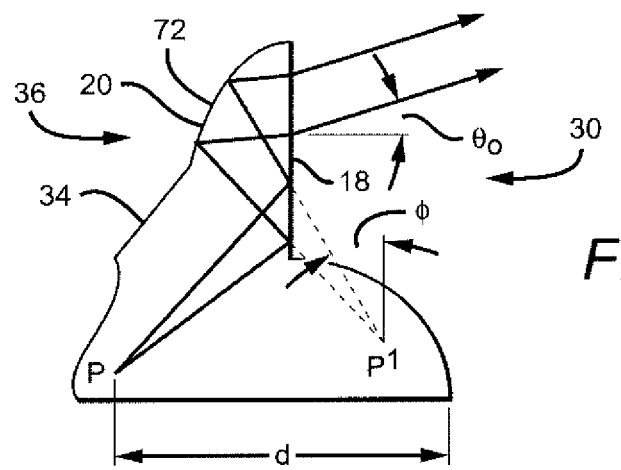

With reference to FIG. 15, in one embodiment, at least one region 72 of the outer portion 36 of the top surface 20 is shaped so that rays emanating from a selected point P and reflecting off the upper portion 30 of the side surface 18 are redirected to be emitted at an angle $\theta_0$ relative to the horizontal axis. Note that the upper portion 30 of the side surface 18 forms a virtual image P' of the point P. The cross-sectional shape of the region 72 of the outer portion 36 of the top surface 20 can then be a parabola that has an axis at the angle $\theta'_0$ and a focus at P'. The shape of the region 72 may be described in polar coordinates centered on P', the shape having the equation:

$$\rho(\phi) = \frac{l}{1 + \cos(\phi + \theta'_0)}$$

where l is a length parameter chosen to ensure that the region 72 intersects the upper portion 30 of the side surface 18 at the desired height. In a preferred embodiment, the selected point P is in the neighborhood of the center of the light source. In a preferred embodiment, the inner portion 34 of the top surface 20 makes an approximately 45 degree angle with the central axis of the body.

Figure 16:
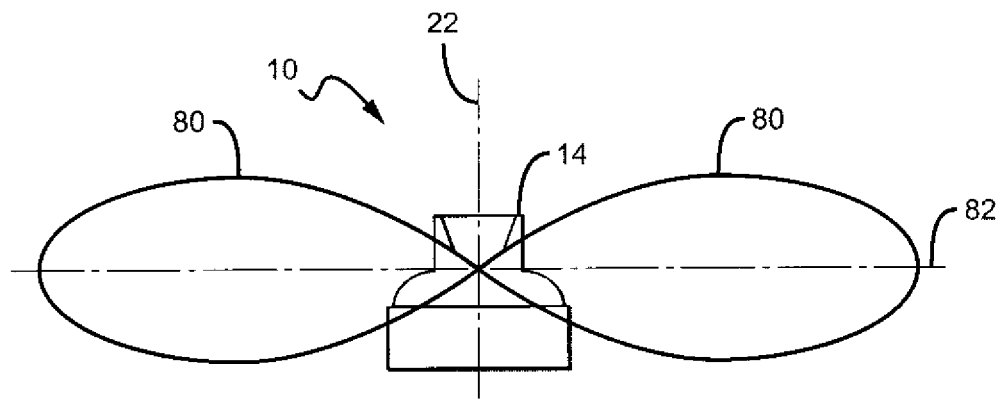
FIG. 16 is an illustration of the side emission of light from the LED package of FIG. 5.

FIG. 16 illustrates a cross-section of the emission of light from the LED package 10 of FIG. 5. The body 14 of LED package 10 creates a radiation pattern 80 or field of illumination that surrounds the LED package 10 and is roughly disk- or toroidal-shaped. The majority of the light emitted from the LED is between 70-110 degrees with respect to the normal axis 22 of the lens.

Figure 17:
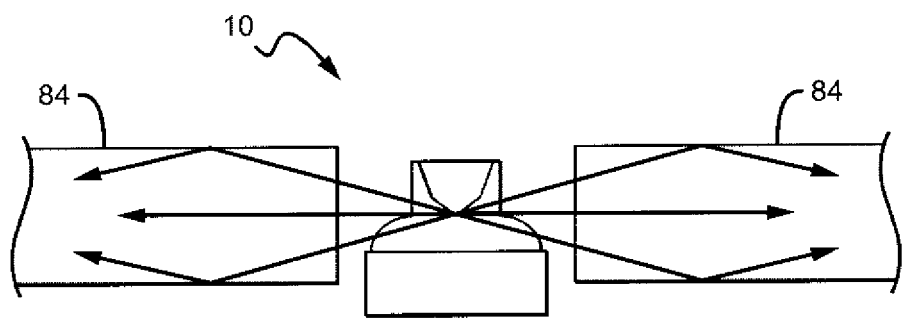
FIG. 17 is a sectional view of the side emission of light from the LED package of FIG. 5 into light guides.

As illustrated in FIG. 17, the side-emission of light allows even a single LED package 10 to illuminate multiple light guides 84. The side-emission of light from the LED package 10 allows light to enter each light guide 89. The LED package 10 may also be inserted into the body of light guide 84. Light guides of various shapes may be used. The sides along the length of the light guides may be planar or taper. For example, a single side emitting LED package 10 may be placed at the center of a disk-shaped light guide (not shown). As light is emitted from the side of LED package 10 in 360 degrees, i.e., in a full circle of directions from the center of LED package 10, said circle substantially coplanar with said disk-shaped light guide, the light enters the light guide and is refracted and reflected throughout the entire light guide (not shown). Other applications for the LED package include LED backlights for LCD Displays, TVs, traffic signals, aviation obstruction lights, LED lamps, lamps in parabolic reflectors and alarm signaling.

It will be apparent from the foregoing that while particular forms of the invention have been illustrated and described, various modifications can be made without departing from the spirit and scope of the invention. Accordingly, it is not intended that the invention be limited, except as by the appended claims.

We claim:

1. A light emitting system comprising:
   one or more emitters on a base;
   at least one reflector proximate to said emitters and comprising a central axis; and
   at least one light guide;
   wherein said light guide is configured to accept at least a portion of light from said emitters;
   wherein said reflector comprises a plurality of faces on either side of said central axis;
   wherein said base comprises a perimeter support surrounding said emitters.

2. The light emitting system of claim 1, wherein said reflector is configured to reflect light from said emitters in a pattern substantially coplanar with said light guide; and
   wherein said light guide is configured to accept said reflected light.

3. The light emitting system of claim 1, wherein said reflector is configured to reflect light in a radial pattern.

4. The light emitting system of claim 3, wherein said light guide comprises a first surface substantially parallel to a primary emission axis of said emitters; and
   wherein said first surface is configured to accept at least about 180 degrees of said radially reflected light.

5. The light emitting system of claim 4, wherein said first surface is configured to accept substantially all of said radially reflected light.

6. The light emitting system of claim 1, wherein said reflector is configured to reflect light in a full circle of directions substantially coplanar with said light guide.

7. The light emitting system of claim 1, wherein said at least one light guide at least partially surrounds said emitters.

8. The light emitting system of claim 1, wherein said emitters are in the center of said light guide.

9. The light emitting system of claim 1, wherein said light guide is disk-shaped.

10. The light emitting system of claim 1, wherein said at least one light guide comprises first and second light guides;
    wherein said reflector is configured to reflect a first portion of light from said emitters in a radial pattern substantially coplanar with said first and second light guides; and
    wherein each of said first and second light guides is configured to accept about half of said first portion of light.

11. The light emitting system of claim 1, wherein an emitter package comprises said reflector and at least one of said emitters, said emitter package configured to emit light in a direction substantially perpendicular to a primary emission axis of said emitters.

12. The light emitting system of claim 1, wherein said portion of light is refracted and reflected throughout said light guide.

13. The light emitting system of claim 1, wherein said portion of light propagates within said light guide via total internal reflection.

14. A light emitting system, comprising:
    an emitter package comprising:
       an emitter on a base to emit light about a primary emission axis;
       a body around said emitter to accept light from said emitter; and
       a metallic reflective layer on a top surface of said body; and
    a light guide at least partially surrounding said emitter package;
    wherein said light guide is configured to accept at least a portion of the light emitted by said emitter package;
    wherein said base comprises a perimeter support surrounding said emitter.

15. The light emitting system of claim 14, wherein said emitter package emits light in a direction substantially perpendicular to said primary emission axis.

16. The light emitting system of claim 14, wherein said light guide comprises a first surface approximately parallel to said primary chip emission axis;
    wherein said first surface is configured to accept light emitted from said emitter package.

17. The light emitting system of claim 16, wherein said first surface is configured to accept substantially all light emitted from said emitter package.

18. The light emitting system of claim 14, wherein said light guide substantially fully surrounds said emitter package.

19. The light emitting system of claim 14, wherein said light guide is substantially disk-shaped.

20. The light emitting system of claim 14, wherein said light guide is substantially planar.

21. The light emitting system of claim 14, wherein said light guide comprises a tapering surface.

22. The light emitting system of claim 14, wherein said light guide comprises a concave or convex surface.

23. The light emitting system of claim 14, wherein said light guide is panel shaped.

24. The light emitting system of claim 14, wherein said light guide comprises a curved surface.

25. The light emitting system of claim 14, wherein an emission surface of said light guide comprises surface roughness.

26. The light emitting system of claim 14, wherein said light guide comprises a sawtooth refractive portion.

27. The light emitting system of claim 14, wherein said light guide comprises a lens.

28. The light emitting system of claim 14, wherein said light guide comprises a Fresnel lens.

29. The light emitting system of claim 14, wherein said portion of light is refracted and reflected throughout the entire light guide.

30. The light emitting system of claim 14, wherein said portion of light propagates within said light guide via total internal reflection.

31. The light emitting system of claim 14, wherein said metallic reflective layer is deposited on said top surface.

32. The light emitting system of claim 14, wherein said metallic reflective layer is on a second body that is adjacent to said body such that said metallic reflective layer is between said body top surface and said second body.

* * * * *